US008410357B2

United States Patent
Paulson et al.

(10) Patent No.: US 8,410,357 B2
(45) Date of Patent: Apr. 2, 2013

(54) BACK CONTACT FOR THIN FILM SOLAR CELLS

(75) Inventors: Puthur D. Paulson, San Jose, CA (US); Craig Leidholm, San Jose, CA (US); Damoder Reddy, Los Gatos, CA (US); Charlie Hotz, Mountain View, CA (US)

(73) Assignee: Solexant Corp., San Jose, CA (US)

( * ) Notice: Subject to any disclaimer, the term of this patent is extended or adjusted under 35 U.S.C. 154(b) by 404 days.

(21) Appl. No.: 12/657,872

(22) Filed: Jan. 28, 2010

(65) Prior Publication Data

US 2010/0229931 A1 Sep. 16, 2010

Related U.S. Application Data

(63) Continuation-in-part of application No. 12/381,637, filed on Mar. 13, 2009, now Pat. No. 7,858,872.

(60) Provisional application No. 61/070,006, filed on Mar. 18, 2008, provisional application No. 61/069,952, filed on Mar. 18, 2008.

(51) Int. Cl.
  *H01L 31/00* (2006.01)
(52) U.S. Cl. ............ 136/264; 136/265; 438/93; 438/95; 257/442
(58) Field of Classification Search .................. 136/255, 136/264, 265; 438/93, 95; 257/442
  See application file for complete search history.

(56) References Cited

U.S. PATENT DOCUMENTS

| 4,456,630 | A | 6/1984 | Basol |
| 4,568,792 | A | 2/1986 | Mooney et al. |
| 5,472,910 | A | 12/1995 | Johnson et al. |
| 5,557,146 | A | 9/1996 | Britt et al. |
| 5,909,632 | A | 6/1999 | Gessert |
| 6,537,845 | B1 | 3/2003 | McCandless et al. |
| 7,220,321 | B2 | 5/2007 | Barth et al. |
| 7,858,887 | B2 | 12/2010 | Allwood et al. |
| 8,143,512 | B2 | 3/2012 | Paulson et al. |
| 2004/0178426 | A1 | 9/2004 | Melekhov et al. |
| 2004/0185672 | A1 | 9/2004 | Polichar et al. |
| 2005/0072461 | A1* | 4/2005 | Kuchinski et al. ............ 136/256 |
| 2005/0186342 | A1 | 8/2005 | Sager et al. |
| 2005/0224111 | A1 | 10/2005 | Cunningham et al. |
| 2006/0060237 | A1 | 3/2006 | Leidholm et al. |
| 2006/0236940 | A1 | 10/2006 | Powell et al. |
| 2007/0163383 | A1 | 7/2007 | Van Duren et al. |
| 2007/0169811 | A1 | 7/2007 | Van Duren et al. |
| 2007/0194694 | A1 | 8/2007 | Reddy |
| 2008/0223430 | A1 | 9/2008 | Krasnov et al. |
| 2008/0308148 | A1 | 12/2008 | Leidholm et al. |
| 2009/0235983 | A1 | 9/2009 | Girt et al. |
| 2009/0235986 | A1 | 9/2009 | Hotz et al. |

FOREIGN PATENT DOCUMENTS

WO WO 2004022637 A2 3/2004

OTHER PUBLICATIONS

Amin "Effect of ZnTe and CdZnTe Alloys at the Back Contact of 1-μm-Thick CdTe Thin Film Solar Cells",Jpn. J. Appl. Phys. vol. 41, May 2002, pp. 2834-2841.*
Studies of ZnTe Back Contacts to CdS/CdTe Solar Cells Gessert, T.A. et al., Presented at the 26th IEEE Photovoltaic Specialists Conference, Sep. 29B. Oct. 1997.

(Continued)

*Primary Examiner* — Jonathan Johnson
*Assistant Examiner* — Devina Pillay
(74) *Attorney, Agent, or Firm* — Charles R. Nold; Nold Intellectual Property Law

(57) ABSTRACT

Disclosed is a novel thin film photovoltaic device and a process of making. The device comprises an interface layer between the absorber layer and the electrode resulting in an improved back contact and improved device efficiency. The interface layer comprises a material comprising a $M_a$-(Group VIA)$_b$ compound, where M is a transition metal the Group VIA designates Te, Se and/or S.

14 Claims, 9 Drawing Sheets

OTHER PUBLICATIONS

Devel. of Cu-doped ZnTe for CdS/CdTe solar cells. Gessert, T.A. et al.; J. of Vacuum Science & Technology A: Vacuum, Surfaces, and Films May 1996 V.14, I: 3, pp. 806-812.

Zhong et al, Alloyed $Zn_xCd_{1-x}S$ nanocrystals with highly narrow luminescence spectral width, J. Am. Chem. Soc. 125 (2003) 13559-13563.

Nie, S.M. et al.; Alloyed semiconductor quantum dots: tuning the optical properties without changing the particle size, J. Am. Chem. Soc. 125 (2003) 7100-7106.

A Novel Chemical Route to ZnTe Semiconductor Nanorods; Li, Yadong et al. Advanced Materials 11(10), pp. 847-850 (1999).

Cation Exchange Reactions in Ionic Nanocrystals; Alivisatos et al. Science Nov. 5, 2004, vol. 306, No. 5698, pp. 1009-1012.

Type-II Quantum Dots: . . . Heterostructures; Bawendi et al. J. Am. Chem. Soc., 2003, 125 (38), 11466-11467.

Singh et al., Thin film CdTe-CdS heterojunction solar cells on light-weight metal substrates, Solar Energy Materials and Solar Cells, 59 (1999) 145-161.

Singh et al., Design issues in the garication of CdS-CdTe solar cells on molybdenum foil substrates, Solar Energy Materials and Solar Cells 76 (2003) 369-385.

Chavez et al., Evaporated cadmium telluride film on steel foil substrates, Journal of Materials Science: Materials in Electronics 6 (1995) 21-24.

Matulionis et al., Cadmium Telluride Solar Cells on Molybdenum Substrates, Mat. Res. Soc. Symp. Proc. vol. 668 (2001).

Written Opinion of the International Searching Authority, PCT/US2011/022654, Mar. 25, 2011.

Quadah et al., $MoTe_2$ Thin Films Synthesized by Solid State Reactions between Mo and Te Thin Films, Phys. Stat. Sol. (a) 134, 455, 1992.

* cited by examiner

BACK CONTACT FOR THIN FILM SOLAR CELLS

CROSS REFERENCE TO RELATED APPLICATIONS

This application is a continuation-in-part of U.S. Ser. No. 12/381,637 filed Mar. 13, 2009, which claims priority to U.S. Provisional Patent Application Ser. No. 61/070,006 filed Mar. 18, 2008 and U.S. Provisional Patent Application Ser. No. 61/069,952 filed Mar. 18, 2008, the contents of all applications are hereby incorporated herein by reference.

BACKGROUND OF THE INVENTION

Solar cells are one of the most promising energy sources available. However, further improvement needs to be made in their efficiency to make them more economically competitive with other energy sources. The invention presented herein provides solar cell technology that dramatically, surprisingly and unexpectedly improves solar cell efficiency.

Solar cells have two general architectural backbone configurations known as "substrate" and "superstrate". A superstrate configuration usually comprises a transparent substrate, a transparent conductive oxide layer (TCO) for a "top" electrode, a window layer, an absorber layer, a back contact layer, and a "bottom" or "back" electrode. Conventionally CdTe solar cells are manufactured in a superstrate configuration with transparent substrates such as rigid glass. A "substrate" configuration has a different architecture, a substrate, a back electrode layer, a back contact layer, an absorber layer, a window layer and a transparent conductive oxide (TCO) layer. A substrate configuration is required when opaque substrates such as flexible metal foils are used for high volume production of CdTe devices.

The solar cell electrical contact at the interface between the absorber layer and the opaque-side electrode is known as the back contact is known as the "back contact". The back contact must meet certain criteria that are generally understood in the art for device optimum performance. For example it is preferred that the interface is prepared such that the current voltage (I-V) curve of the device is substantially linear and symmetric, which is the signature of an ohmic contact. To form an ohmic contact with p-type semiconductors, the top of the semiconductor valence band has to align with the Fermi level of the metal. This necessitates an electrode metal with a work function higher than the electron affinity plus the band gap of the absorber material. For CdTe, a preferred absorber material the work function needs to be greater than about 6 eV.

The difficulty in providing ohmic contacts to semiconductor absorber thin films is that there is no practical metal with a work function greater than about 6 eV thus making it extremely difficult to produce an ohmic contact.

One way the prior art addresses the problem is by forming pseudo-ohmic contacts which requires treating a Group II-VIA semiconductor surface with various chemical etchants. Chemical etching methods are difficult to control and if uncontrolled have the potential to etch grain boundaries of the absorber semiconductor which can reduce the efficiency of the solar cells. Also, and most important in a substrate configuration solar cell, a thin layer cannot be created by the prior art treatment of Group II-VIA semiconductor compound layer surfaces, since the Group II-VIA semiconductor compound layer is deposited after the metal deposition and not accessible for such treatment. Another prior art solution to forming ohmic contacts between a CdTe absorber layer and the back electrode material in superstrate CdTe solar cells is using a film of ZnTe on CdTe, see Studies of ZnTe Back Contacts to CdS/CdTe Solar Cells T. A. Gessert, P. Sheldon, X. Li, D. Dunlavy, D. Niles, R. Sasala, S. Albright and B. Zadler. Presented at the 26th IEEE Photovoltaic Specialists Conference, September 29B. October 1997, the contents of which are incorporated herein by reference in its entirety. Another prior art solution in superstrate devices is using copper-doped ZnTe on CdTe, see "*Development of Cu-doped ZnTe as a back-contact interface layer for thin-film CdS/CdTe solar cells.*" T. A. Gessert, A. R. Mason, P. Sheldon, A. B. Swartzlander, D. Niles, and T. J. Coutts. Journal of Vacuum Science & Technology A: Vacuum, Surfaces, and Films May 1996 Volume 14, Issue 3, pp. 806-812, the contents of which are hereby incorporated by reference in its entirety. V. P. Singh et al./*Solar Energy Materials & Solar Cells* 59 (1999) 145-161 suggested using a thin layer (about 50 nm) of Cu and Te between a Mo electrode and a CdTe absorber. US Published Patent Application No. 20090235983 A1 teaches forming a thin highly doped p-semiconductor before depositing the CdTe absorber layer.

None of the prior art solutions solves the problem of creating a successful ohmic contact satisfactorily in either substrate or superstrate configuration solar cells. Accordingly there is a need for an improved solar cell having increased efficiency due to the improved ohmic contact between the absorber layer and the metal electrode layer.

SUMMARY OF THE INVENTION

Disclosed herein is a photovoltaic device comprising a substrate, a back electrode layer, an absorber layer comprising a first semiconductor composition, and an interface layer disposed between the back electrode layer and the absorber layer, wherein the interface layer comprises a first interface composition comprising a $M_a$-(Group VIA)$_b$ compound, where M is a transition metal and the Group VIA compound designates an element chosen from the group consisting of Te and S, and where $0<a\leq3$ and $0<b\leq4$. In one embodiment the absorber layer comprises CdTe, and the interface layer comprises a first interface composition comprising a $M_a$-(Group VIA)$_b$ compound, where M is a transition metal and the Group VIA compound designates an element chosen from the group consisting of Te, Se and S, and where $0<a\leq3$ and $0<b\leq4$. In another embodiment the absorber layer comprises CdTe, and the interface layer comprises $Mo_xTe_y$, where $0<x\leq3$ and $0<y\leq4$. In a preferred embodiment the interface layer comprises $MoTe_2$ and/or $Mo_3Te_4$. In one embodiment the interface layer and/or the absorber layer are p-doped. The dopant may comprise copper. In one embodiment the interface layer comprises a first interface layer and a second interface layer, wherein said first interface layer is disposed next to the absorber layer and said second interface layer is disposed next to said back electrode, and said first interface layer comprises a mixture of said first semiconductor composition and said first interface composition, and a second interface layer comprising said first interface composition. In one embodiment the absorber layer comprises a CdTe semiconductor, and the first interface layer and said second interface layer are either the same or different and comprise $Mo_xTe_y$, where $0<x\leq3$ and $0<y\leq4$. In one embodiment the first interface layer and said second interface layer are either the same or different and comprise $MoTe_2$ and/or $Mo_3Te_4$. In one embodiment the first interface layer, the second interface layer and/or the absorber layer are each independently doped or undoped. In one embodiment the back electrode consists essentially of a $M_a$-(Group VIA)$_b$ compound, where M is a transition metal and the Group VIA compound designates an element chosen from the group consisting of Te, Se and S, and where 0<a≦3 and 0<b≦4. In one embodiment the absorber layer comprises CdTe, and the back electrode consists essentially of $Mo_xTe_y$, where 0<x≦3 and 0<y≦4. In one embodiment the absorber layer comprises CIGS, and the interface layer comprises a first interface composition comprising a $M_a$-(Group VIA)$_b$ compound, where M is a transition metal and the Group VIA compound designates an element chosen from the group consisting of Te and S, and where 0<a≦3 and 0<b≦4. The invention discloses a process for making a photovoltaic device, comprising depositing a first metal layer on a substrate surface, depositing a second layer comprising a Group VIA element, wherein upon subsequent processing said first metal layer and said second layer comprising a Group VIA element react to form a layer comprising a metal-Group VIA compound. In one embodiment said subsequent processing comprises depositing an absorber layer or annealing. In one embodiment a dopant material is deposited between the first and second layers. In one embodiment the thickness of the first and second layers are chosen such that after annealing there is a thin metal layer comprising the first metal under the layer, said thin metal layer capable of functioning as a back electrode. In one embodiment the thickness of the first and second layers are chosen such that after annealing there is no thin metal layer comprising the first metal under the layer, said layer is capable of functioning as a back electrode.

DETAILED DESCRIPTION OF THE EMBODIMENTS

Figure 1:
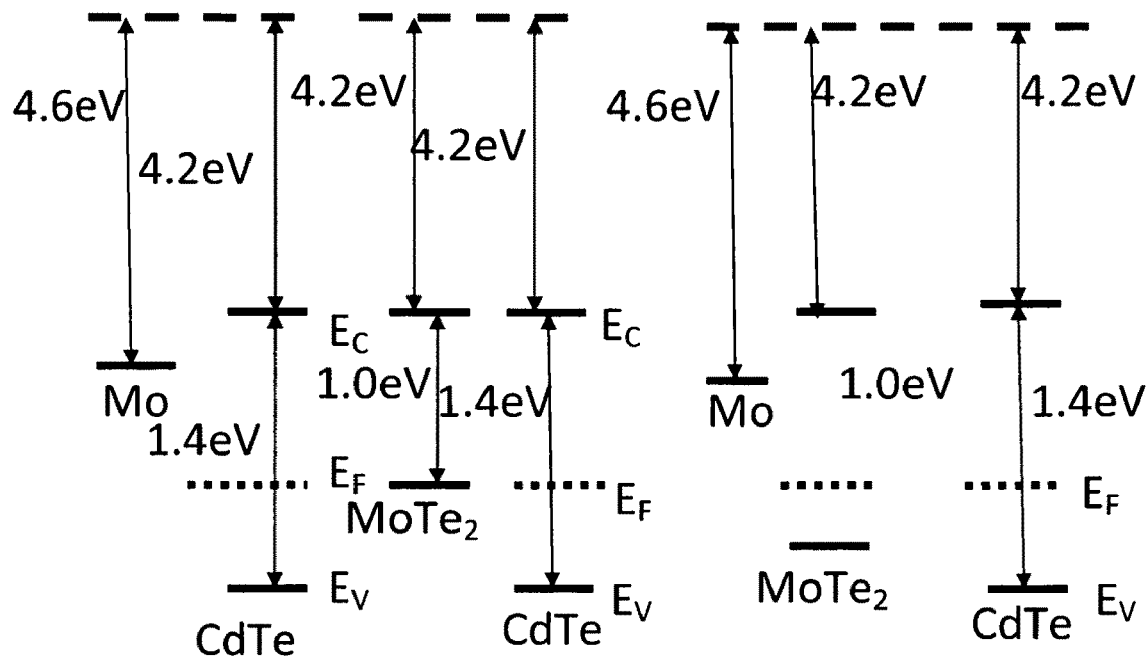
FIG. 1 shows a band diagram of several heterojunctions including a $MoTe_2$/Mo junction.

Reference will now be made in detail to some specific embodiments of the invention including the best modes contemplated by the inventors for carrying out the invention. Examples of these specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In this specification and the appended claims, the singular forms "a," "an," and "the" include plural reference unless the context clearly dictates otherwise. Unless defined otherwise, all technical and scientific terms used herein have the same meaning as commonly understood to one of ordinary skill in the art to which this invention belongs.

The interface between a semiconductor absorber material and a metal electrode is known as a heterojunction. It is important for device performance that an ohmic contact exists at this heterojunction between the two materials. An ohmic contact is evidenced when current voltage (I-V) curve of the device is substantially linear and symmetric, linear near and above Voltage>Voc. If the curve is not linear, but is "bent" "band bending" is said to occur. Band bending refers to the local change in energy of electrons at a semiconductor junction due to space charge effects. Because the common way to visualize the electron energy states and Fermi levels in a material is to draw bands on an energy vs. distance plot, band bending refers to bending in these diagrams and not in any physical form. Band bending can occur when two materials with different local work functions are placed in contact. In general, bands will bend locally when materials come in contact, because the two Fermi levels of the materials will equilibrate to the same level through a local exchange of charge (either holes or electrons). This exchange of charge changes the energies of those charge carriers who have been exchanged, giving a curvature to the energy vs. distance diagram near the junction. Put another way, when two materials are brought together and allowed to reach chemical/thermal equilibrium the Fermi level in each material aligns and is constant throughout the system. To the extent that they are able, electrons in the materials leave some regions (depletion) and build up in others (accumulation) in order to find equilibrium. When this occurs a certain amount of band bending occurs near the interface. Knowing how bands will bend when two different types of materials are brought in contact can indicate whether the junction will be Schottky or ohmic. The degree of band bending depends on the relative Fermi levels and carrier concentrations of the materials forming the junction.

Each material at a junction is made up of a crystal lattice whose electrical properties depend on a periodic arrangement of atoms. This periodicity is broken at the heterojunction interface to varying degrees. In cases where both materials have the same lattice, they may still have differing lattice constants which give rise to crystal strain which changes the band energies. In other cases the strain is relaxed via dislocations and other interfacial defects which also change the band energies. It is postulated that the band gap mismatch may cause deep electronic states that capture and emit elections and holes from the conduction band and the balance band leading to non-radiative recombination degrading solar cell performance.

To form an ohmic contact with p-type semiconductors, the top of the semiconductor valence band has to align with the Fermi level of the metal. This principle is illustrated with reference to FIG. 1, which shows a band diagram for four heterojunctions: Mo/CdTe; $MoTe_2$/CdTe; Mo/$MoTe_2$ and $MoTe_2$/CdTe. Calculating the energy barrier for an ideal heterojunction uses energy band offsets is straightforward using a material's band gap, electron affinity and work function. The energy difference between the valence band ($E_V$) and conduction band ($E_B$), called the band gap, is anywhere from 0 eV for a metal (there is no gap) to over 4 eV for an insulator. The work function $\phi$ of a material is the energy difference between the Fermi energy $E_f$ (chemical equilibrium energy) and the vacuum level (where electron removal occurs). Finally the electron affinity $\chi$ of each material is needed which is the energy difference between the conduction band and the vacuum level. Calculating energy band offsets for an ideal heterojunction is straightforward with these properties using the Anderson's rule. The conduction band offset depends only on the electron affinity difference between the two semiconductors: $\Delta E_C = \chi_1 - \chi_2 = \Delta \chi$
Then using the change in band gap:

$$\Delta E_G = E_{G2} - E_{G1}$$

The valence band offset or barrier at the heterojunction is given by:

$$\Delta E_V = \Delta E_G - \Delta \chi.$$

With reference to FIG. 1 and for a Mo/CdTe system the conduction band offset $\Delta E_C$ is given by $$\Delta E_C = 4.6 \text{ eV} - 4.2 \text{ eV} = 0.4 \text{ eV} = \Delta \chi.$$

The change in the band gap energy $\Delta E_G$ is $$\Delta E_G = 1.4 \text{ eV} - 0 \text{ eV} = 1.4 \text{ eV}; \text{ and thus the band offset}$$
$$\Delta E_V \text{ or barrier is given by:}$$

$$\Delta E_V = 1.4 \text{ eV} - 0.4 \text{ eV} = 1.0 \text{ eV}.$$

It can be seen that using a p type $MoTe_2$ composition the barrier between $MoTe_2$ and Mo is lower than between CdTe and Mo. Also the barrier between CdTe and $MoTe_2$ is lower. Thus one would expect band bending to occur at a Mo/CdTe interface.

By "photovoltaic device" it is meant a multilayered device capable of converting light into electricity. The device may have a substrate or superstrate configuration. Materials suitable for photovoltaic cell layers disclosed herein may be found in Durstock, M. et al. "Materials for photovoltaics: symposium held Nov. 29-Dec. 2, 2004, Boston, Mass., USA: Symposium proceedings/Materials Research Society v. 836 (2005), the contents of which are incorporated herein by reference. The invention as described herein is also suitable for tandem photovoltaic cells. Suitable architecture for tandem devices useful with this invention are described in "*Preparation and Characterization of Monolithic HgCdTe/ CdTe Tandem Cells*" Mater. Res. Soc. Symp. Proc. Vol. 836, p. 265-270 (2008), the contents of which are incorporated herein by reference.

The substrate may a conductive or non-conductive material. Metals or metal alloys are suitable. Stainless steel or aluminum are preferred. In some embodiments the substrate can be a flexible transparent polymer film (such as polyimide) or rigid transparent glass (borosilicate or soda lime). The thickness of the substrate can be 25-500 microns for flexible metal foils, 10-100 microns for flexible polymer films or 1-5 mm for glass. It is understood that the substrate may include barrier layers comprising silicon nitride and/or other compounds. The substrate may be opaque or transparent.

"Ohmic contact layer" and "Interface layer" as used herein are meant to include a layer or plurality of layers that is located between the metal electrode and absorber layer. Thus by definition an "interface layer" includes a single layer as well as a set of multiple layers which may be 1, 2, 3, 4, 5 or more layers. The "interface layer" used in accordance with the present invention has been prepared so that the current voltage (I-V) curve of the device is substantially linear and symmetric. If the I-V characteristic is substantially non-linear and asymmetric, the layer can instead be termed a blocking or Schottky contact. The invention contemplates that multiple different ohmic contact layers can be deposited, preferably sequentially. In one embodiment of the present invention the absorber layer comprises a Group II-VI semiconductor compound and the interface layer comprises at least one layer comprising $M_a$-(Group VIA)$_b$, where M is a transition metal and the Group VIA compound designates an element chosen from the group consisting of Te, Se and S; a and b are both greater than 0 and may be any number to form a material comprising M and a Group VIA element, preferably $0 < a \leq 3$ and $0 < b \leq 4$. Preferably M comprises Mo and the Group VIA compound comprises Te and a=x and b=y; thus $Mo_xTe_y$, where $0 < x \leq 3$ and $0 < y \leq 4$; preferably $1 \leq x \leq 3$ and $2 \leq y \leq 4$, even more preferably $Mo_xTe_y$ is $MoTe_2$ or $Mo_3Te_4$ and/or mixtures of both $MoTe_2$ and $Mo_3Te_4$. In another embodiment of the present invention the absorber layer comprises a CIGS semiconductor compound and the interface layer comprises at least one layer comprising $M_a$-(Group VIA)$_b$, where M is a transition metal and the Group VIA compound designates an element chosen from the group consisting of Te and S; a and b are both greater than 0 and may be any number to form a compound comprising M and a Group VIA element, preferably $0 < a \leq 3$ and $0 < b \leq 4$. Preferably M comprises Mo and the Group VIA compound comprises Te and a=x and b=y; thus $Mo_xTe_y$, where $0 < x \leq 3$ and $0 < y \leq 4$; preferably $1 \leq x \leq 3$ and $2 \leq y \leq 4$, even more preferably $Mo_xTe_y$ is $MoTe_2$ or $Mo_3Te_4$ and/or mixtures of both $MoTe_2$ and $Mo_3Te_4$. In addition to those interface layers disclosed herein, other examples of materials suitable for an interface layer between an electrode layer and the absorber layer include those disclosed in commonly assigned and copending U.S. Ser. No. 12/381,637 filed 13 Mar. 2009, the contents of which is incorporated herein by reference. In some embodiments it may be useful to include interface layers between the absorber layer and the window layer as taught in commonly assigned and copending U.S. Ser. No. 12/383,532, filed 24 Mar. 2009, the contents of which are incorporated herein by reference. As used herein, "said first interface layer is disposed next to the absorber layer" includes those embodiments where there is an absorber layer and then the interface layer in contact with the absorber layer is an interdiffused mixture comprising a diffused mixture of absorber material, another interface layer material and any dopant present, for example the first interface layer may include an interdiffused mixture of $CdTe:MoTe_2:Cu$.

As used herein the term "interdiffuse" refers to the mixing of one or more elements or compounds with one another. The term interdiffused as used herein is not restricted to strictly homogeneous mixing of layers or materials, but does not exclude it either.

As used herein the metal electrode is also referred to as a "back electrode". This layer may comprise a transition metal. Preferred is Mo. In one embodiment of the present invention the process disclosed herein produces an electrode that is not pure metal but comprises a $M_a$-(Group VIA)$_b$ compound, where M is a transition metal and the Group VIA compound designates an element chosen from the group consisting of Te, Se and S; a and b are both greater than 0 and vary to form a material of each particular element M and Group VIA and are described herein, preferably $0 < a \leq 3$ and $0 < b \leq 4$. More preferably in this invention M comprises Mo and the Group VIA compound comprises Te and a=x and b=y; thus $Mo_xTe_y$, where $0 < x \leq 3$ and $0 < y \leq 4$; preferably $1 \leq x \leq 3$ and $2 \leq y \leq 4$, even more preferably $Mo_xTe_y$ is $MoTe_2$ or $Mo_3Te_4$ and/or mixtures of both $MoTe_2$ and $Mo_3Te_4$. In this embodiment there is little or no detectable metal film present between the substrate/$Si_3N_4$ and any barrier layers and/or absorber layers.

When this invention refers to $Mo_xTe_y$, it means a composition where $0<x\leq3$ and $0<y\leq4$; preferably $1\leq x\leq3$ and $2\leq y\leq4$, even more preferably $Mo_xTe_y$ is $MoTe_2$ or $Mo_3Te_4$ and/or mixtures of both $MoTe_2$ and $Mo_3Te_4$.

The window layer may have a thickness of between about 20-200 nm and is deposited by methods well known in the art such as chemical bath deposition, close space sublimation, vapor transport deposition, sputtering, etc. For this invention CdS is preferred as a window material.

The transparent conducting electrodes are usually n-type materials with good conductivity and high transparency in the visible spectrum and may comprise a material chosen from the group consisting of ZnO, ITO, $SnO_2$, $Cd_2SnO_4$, $In_2O_3$ or $Zn_2SnO_4$. Preferably ZnO is used for its optoelectronic properties and its mechanical, thermal and chemical stability. The transparent conducting electrode layer can be 50-1,000 nm. The TCO may be deposited by chemical or physical vapor deposition methods well known in the art. A ZnO layer can consist of a resistive intrinsic ZnO layer and a conductive metal (ex: aluminum) doped ZnO layer, i.e. a dual layer. Two different transparent conducting electrode layers may be used in combination if desired and thus take advantage of differing properties of two different materials. The TCO may also comprise nanowires as disclosed in U.S. Pat. No. 7,265,037 the contents of which are incorporated herein by reference.

The absorber layer according to the present invention preferably comprises Group II-VIA materials such as CdTe, ZnTe and/or HgTe. Preferred is CdTe. This layer is about 1-10 micron thickness and can be deposited by methods known in the art such as close spaced sublimation, vapor transport deposition, etc. The absorber layer may comprise one layer or a plurality layers. In some embodiments the absorber layer is p-doped, preferably with Cu. In one embodiment the absorber layer may have partially interdiffused material from the adjacent layers. Also included is CIGS, $CuIn_xGa_{1-x}Se$, where $0\leq x<1$. Included herein includes the family of materials generally referred as CIGS including CIS, CISe, CIGSe, CIGSSe As used herein "deposit" or "depositing" includes the steps of forming a layer, including but not limited to those step or steps for forming, reacting, etching and/or scribing a layer which includes physical vapor deposition (PVD), chemical vapor deposition (CVD), evaporation and sublimation.

By transition metal it is meant to include Scandium, Titanium Vanadium, Chromium, Manganese, Iron, Cobalt, Nickel, Copper, Zinc, Yttrium, Zirconium, Niobium, Molybdenum, Technetium, Ruthenium, Rhodium, Palladium, Silver, Cadmium, Lanthanum, Hafnium, Tantalum, Tungsten, Rhenium, Osmium, Iridium, Platinum, Gold, Mercury, Actinium, Rutherfordium, Dubnium, Seaborgium, Bohrium, Hassium, Meitnerium, Darmstadtium and Roentgenium.

One having ordinary skill in the art will appreciate that the figures are illustrative and not exhaustive examples depicting an order of operative layers in a photovoltaic device. Unless so indicated by restricting and/or limiting language additional layers and/or parts of the photovoltaic device have been omitted for clarity.

More detail of the invention and its embodiments is provided in the Examples. X-ray diffraction and cross-sectional scanning electron microscope (SEM) images were used to evaluate phase purity and grain size in the resulting films on Stainless Steel/Mo substrates. Energy Dispersive Spectrometry Analysis (EDS) analysis was used to determine the spatial distribution of the elements through the device.

EXAMPLE 1

Figure 2:
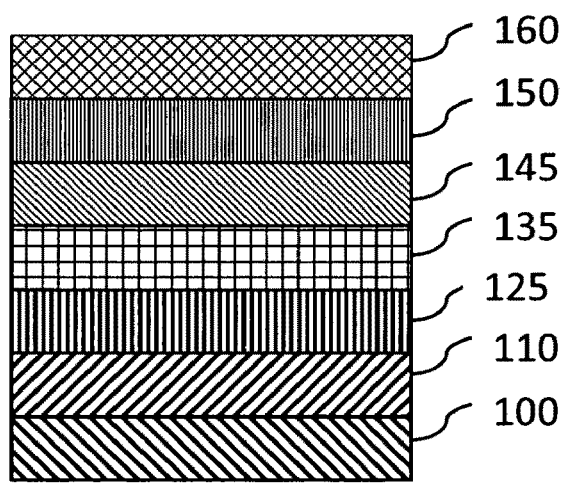
FIG. 2 shows schematic of a cross section of a solar cell in accordance with Example 1 of this invention.

A photovoltaic cell in accordance with one embodiment of the present invention shown in FIG. 2 was made in a roll to roll deposition process on a substrate 100 as it is moved through deposition zones. Examples of such process are given in copending and commonly assigned U.S. Published Patent No. 20090223551 filed Mar. 2, 2009 the contents of which are hereby incorporated herein in its entirety.

A roll of stainless steel held under tension is used to supply a stainless steel substrate 100 and a layer of $Si_3N_4$ (omitted from Figures for clarity) is deposited thereon. A back contact interface layer is constructed along with a back electrode as follows. A back electrode 110 precursor material comprising a first metal layer of Mo is deposited on the substrate 100 using DC sputtering to a thickness of about 400 nm. Here Mo was used, but the invention contemplates that any transition metal may be used. The first metal layer thickness suitable for embodiments of this invention may be 100-1000 nm thick, preferably the layer 110 is 400 nm. Sputtering conditions are preferably chosen to provide for a Mo layer that is relatively stress free. Generally a lower process pressure process results in compressive stress in Mo films while a higher process pressure results in tensile stress. An approximately 20 nm thick Cu film (intended as the p-type dopant for both CdTe as well as $MoTe_2$ layers in this embodiment; is deposited on the Mo layer by DC sputtering. The copper amount may be varied between non-discernable amounts to 50 nm thick. Preferably the copper layer is about 2.5 nm thick. One skilled in the art will appreciate that other dopants are suitable besides Cu. Preferably sputter conditions are chosen to provide a continuous Cu film. A second layer comprising Te was deposited to a thickness of 700 nm on the Cu layer by a vapor transport technique. A thick layer is important, preferably over 200 nm, more preferably 500-900 nm thick initial Group IV layer. Te, Se or S are suitable here. Even more preferably a 600-800 nm Te layer is deposited and more preferably a 700 nm layer is deposited. The Te layer deposition process pressure was 20 Torr with the Oxygen concentration less than 100 ppm, measured using a residual gas analyzer. During deposition of the $Si_3N_4$ barrier layer and the first metal layer comprising Mo the substrate 100 temperature rises to about 300° C. As the substrate 100 moves it then cools and the temperature for the Cu deposition was about 100° C. The substrate 100 temperature was maintained at less than 200° C. during the second layer of Te deposition. The substrate 100 temperature was raised to about 600° C. and a layer of CdTe 145 was deposited on the Te layer using a vapor transport technique. The deposited 400 nm Mo layer is partially converted to a Mo layer 110. A layer of $MoTe_2$ 125 that is p-doped is formed because the heat during the CdTe deposition will interdiffuse the Mo/Cu/Te stack. The $MoTe_2$ layer restricts the transport of Cu into the CdTe layer 145 during elevated temperatures or stress. The temperature during CdTe deposition may be in the range of 450-650° C. for about 2 minutes preferably in a Nitrogen atmosphere. There is Te, Cu and Mo inter-diffusion during CdTe deposition due to the high temperature of the CdTe deposition to form a Mo layer 110 followed by a p-doped $MoTe_2$ layer 125 because there was excess Mo. In this example the initial Mo/Te layer thickness ratio is selected in such way that the entire Mo layer is not interdiffused with the Te layer and the Cu layer and therefore a distinct Mo layer remains underneath the p-doped $MoTe_2$ layer 125 after the CdTe deposition. Preferably the remaining Mo layer 110 is about 1 to 300 nm, more preferably between 200 to 250 nm thick underneath the $MoTe_2$ interface layer 125. Preferably the $MoTe_2$ interface layer 125 is about 300-800 nm thick even more preferably 600-700 nm thick. During heating a first interface layer 135 comprising an interdiffused mixture of Cu doped CdTe:$MoTe_2$ is formed above the second interface layer 125 Cu doped $MoTe_2$. The device is completed by depositing a window layer 150 comprising CdS and a transparent conductor 160 AZO. The absorber layer 145 can be subjected to a $CdCl_2$ treatment well known in the art to increase the grain size. The absorber layer 145 can be chemically etched by methods well known in the art.

Other methods of synthesizing the back contact layers including the $MoTe_2$ films used in this invention are known in the art and are suitable for making devices according to the present invention. See for example A. OUADAH et al.: MoTe, Thin Films Synthesized by Solid State Reactions, Phys. stat. Sol. (a) 134, 455 (1992), the contents of which incorporated herein by reference. $Mo_xTe_y$ may also be deposited using chemistry known in the art, see for example U.S. Pat. No. 3,385,667 which describes a method for forming thin films of $MoTe_2$, the contents of which are incorporated herein by reference. After the first metal layer is formed comprising a transition metal and the second Group VI metal is deposited, subsequent processing includes but is not limited to annealing or depositing an absorber composition. Prior to depositing an absorber composition the two metal layers may be heated to react and from an interface layer.

Figure 3:
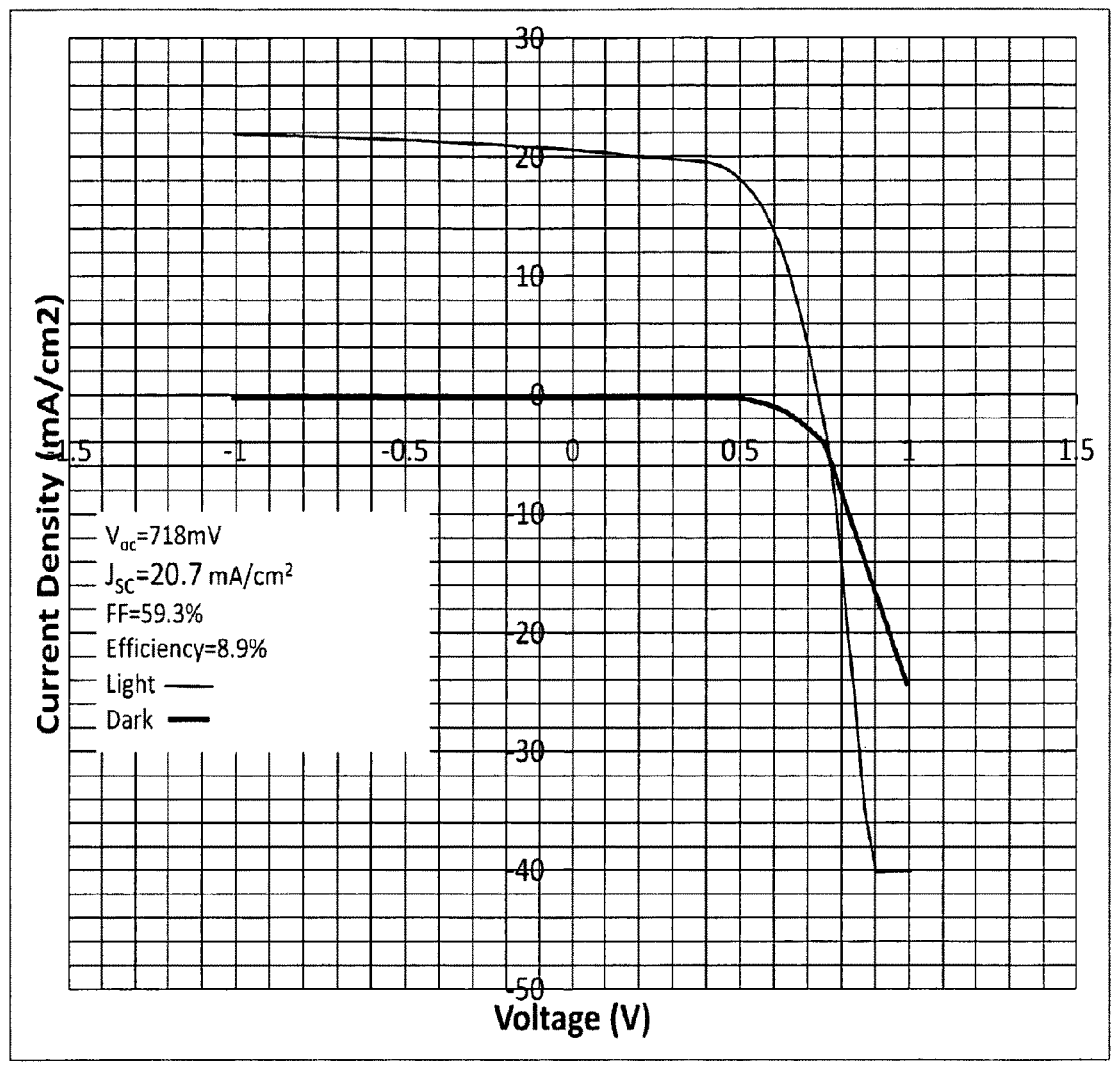
FIG. 3 is a graph illustrating current density (J) versus voltage (V) curves (I-V) of an Example 1 device.

A current voltage curve of the device constructed in Example 1 is shown in FIG. 3. It is clear that the current voltage curve is linear as it crosses the x axis evidencing an ohmic contact in the device.

A SEM of a cross section of the device constructed in Example 1 was taken. One can see the CdTe layer 145 and a $MoTe_2$ layer 125. Secondary ion mass spectroscopy (SIMS) depth profiles of Cu, Mo, Cd and Te for a Cu doped $MoTe_2$ layer 125 show that there is a Cu gradient throughout the $MoTe_2$ 125 layer.

Energy Dispersive Spectrometry Analysis (EDS) analysis was used to confirm the distribution of elements in the $MoTe_2$ layer 125. The EDS instrument used was a Princeton Gamma Tech instrument and the analyzing software was Spirit™. A solar cell was disassembled to extract a portion of a single cell. It was analyzed in the cross-sectional view and the planar view. Examination took place using a tungsten filament SEM. Cross section analysis was performed at 7.5 kV, 10 kV, and 20 kV to provide a compositional analysis at about 0.2 micron, 0.5 micron and 1 micron, respectively. EDS analysis also confirmed the compositional ratios at different thicknesses in the CdTe layer 145.

X-Ray diffraction analysis was used to confirm the composition of the MoTe2:CdTe2:Cu layer 135. A photovoltaic device in accordance with Example 1 was constructed and during construction the CdTe layer 145 was peeled during the $CdCl_2$ treatment to facilitate X-ray measurement directly on the interface layer. An XRD scan of the device evidenced $MoTe_2$-Strong 002 texture.

EXAMPLE 2

A substrate semiconductor solar cell was constructed similarly to the method set forth in Example 1, except the thickness of the second layer comprising a Group VIA element comprising Te was 30 nm thick.

EXAMPLE 3

A substrate semiconductor solar cell was constructed similarly to the method set forth in Example 1, except the thickness of the second layer comprising a Group VIA element comprising Te was 300 nm thick.

Figure 4A:
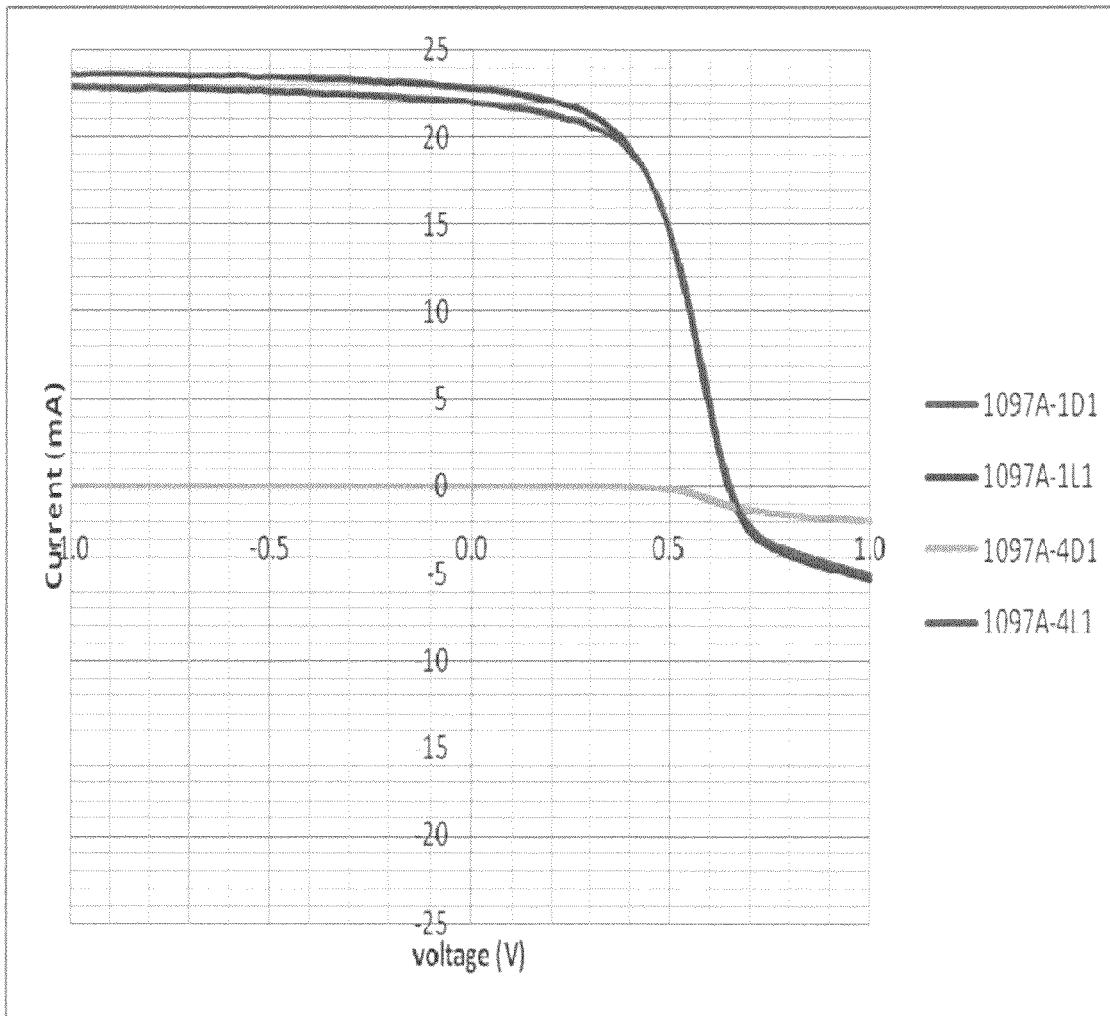
FIGS. 4A, 4B and 4C show I-V curves for devices constructed in accordance with Examples 1, 2 and 3 using different initial transition metal layer thicknesses.
Figure 4B:
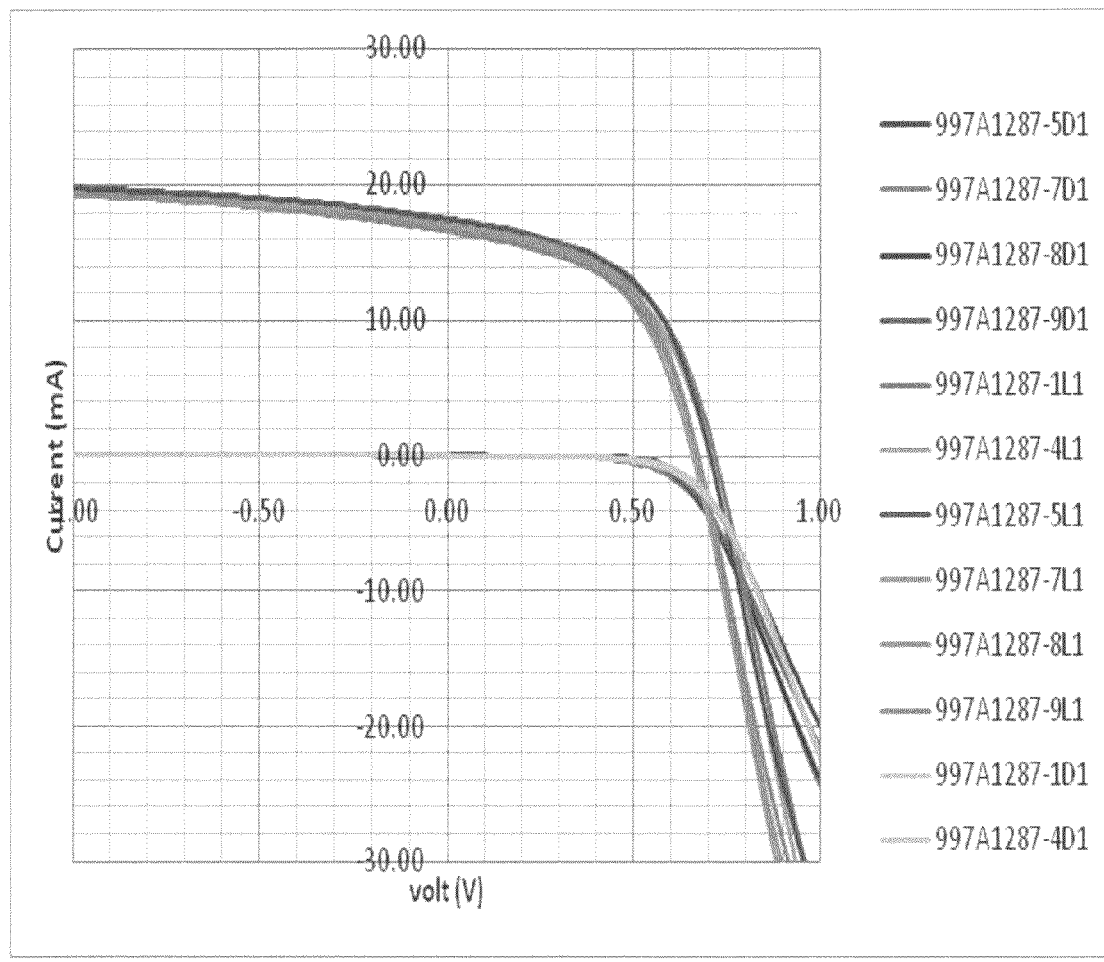
Figure 4C:
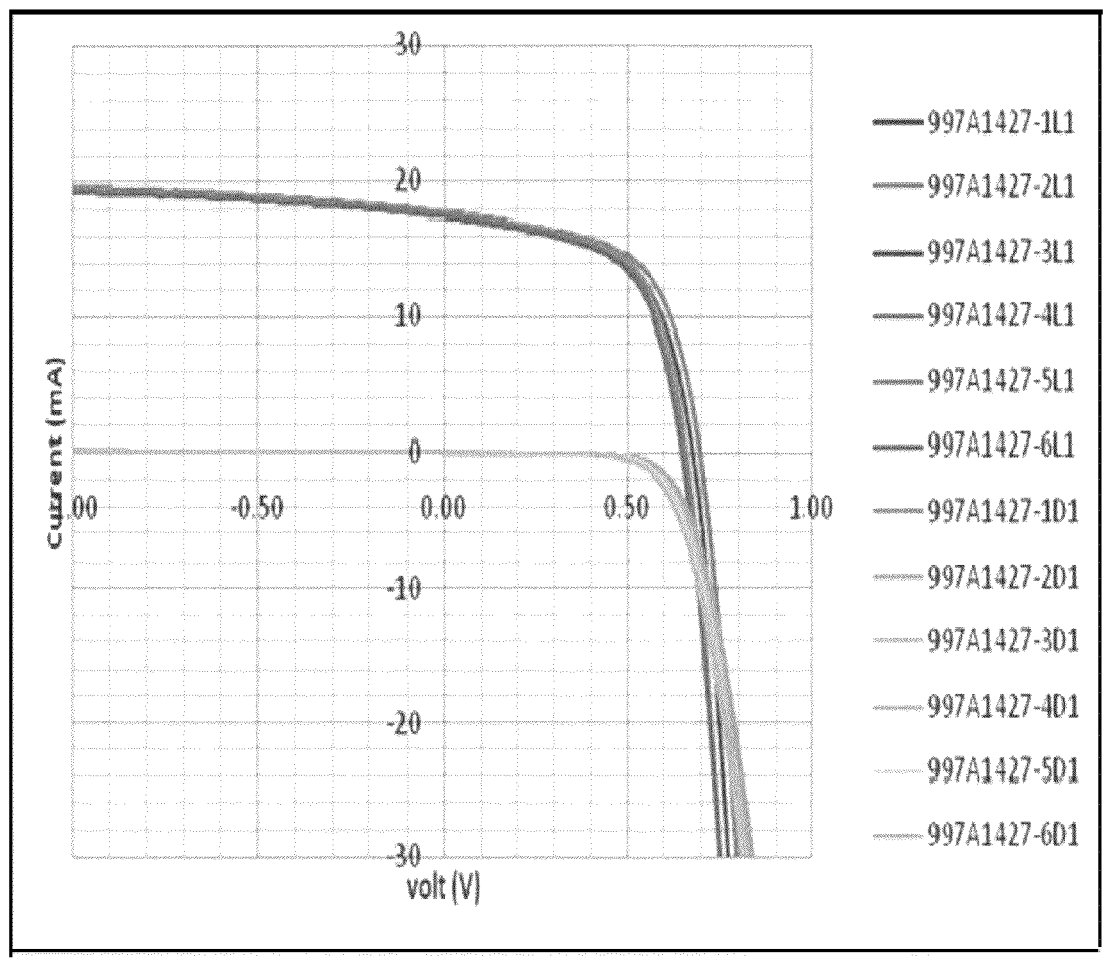

FIGS. 4A, 4B and 4C show the comparison of three devices constructed in Examples 2, 3 and 1, respectively using a different thickness of Te layer. FIG. 4A clearly shows the device with the thin 30 nm Te thick layer displays significant roll-over, while the thick Te device at 700 nm does not FIG. 4C. This data unexpectedly demonstrates that a thick interface layer dramatically improves device performance, in counter distinction to the teachings of the prior art.

EXAMPLE 4

Figure 5:
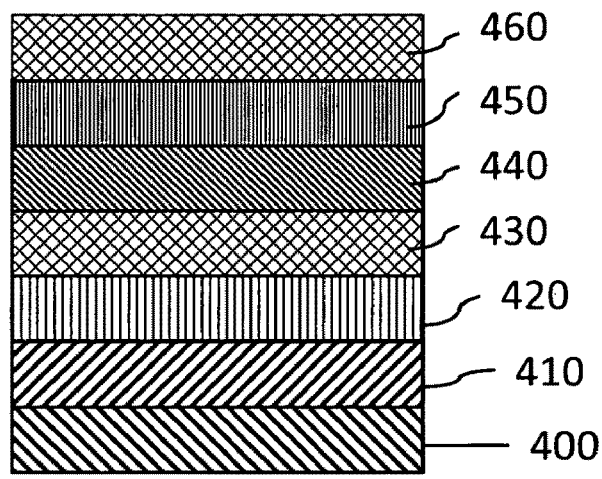
FIG. 5 shows the structure of a solar cell described in Example 4.

In another embodiment of the present invention a solar cell FIG. 5 having architecture of Example 1 is contemplated, except the Cu layer is omitted during the manufacture. As in Example 1 the back contact interface layer may comprise at least a dual layer including a first interface layer 430 comprising a mixture of CdTe and $MoTe_2$, undoped and a second interface layer comprising $MoTe_2$ 420. A substrate 400 has thereon (barrier nitride layers not shown here) has a Mo back electrode 410. CdTe absorber layer 440 is on top of first interface layer 430 followed by a window layer 450 and transparent conductor 460.

EXAMPLE 5

Figure 6:
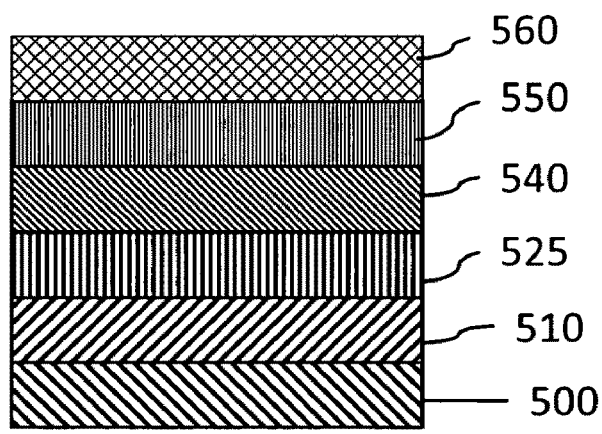
FIG. 6 shows the structure of a solar cell described in Example 5.

In another embodiment of the present invention a solar cell FIG. 6 having architecture of Example 1 is contemplated, except that only a single interface layer 525 is present, which is doped, preferably p-doped with copper. Semiconductor absorber layer 540 is on top of p-doped $MoTe_2$ interface layer 525 followed by a window layer 550 and transparent conductor 560. Metal electrode 510 is Mo. Copper content of p-doped $MoTe_2$ layer 525 is preferred in the range of less than about 1 to about 10 atomic percent of Copper. In one embodiment of the present invention Cu doped $MoTe_2$ and $Mo_3Te_4$ thin films are readily prepared from copper doped $Mo_xTe_y$ targets by using physical vapor deposition methods known in the art. By depositing the CdTe using a low temperature process the diffusion of Cu into the CdTe region is restricted.

EXAMPLE 6

Figure 7:
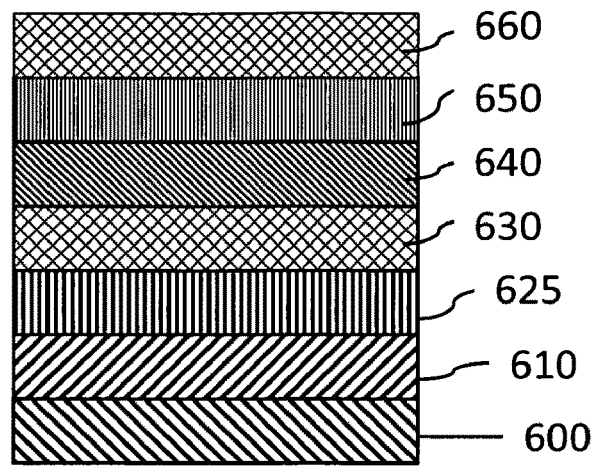
FIG. 7 shows the structure of a solar cell described in Example 6.

In another embodiment of the present invention a solar cell FIG. 7 similar to that of Example 1 is contemplated but only the second interface layer $Mo_xTe_y$ 625 is doped, preferably p-doped with copper. A substrate 600 has coated thereon a Mo electrode 610 followed by a p-doped $Mo_xTe_y$ interface layer 625, followed by an interdiffused CdTe:$Mo_xTe_y$ composition 630. CdTe semiconductor absorber layer 640 is deposited on top of the first interface layer 630 followed by a window layer 650 and transparent conductor 660.

EXAMPLE 7

Figure 8:
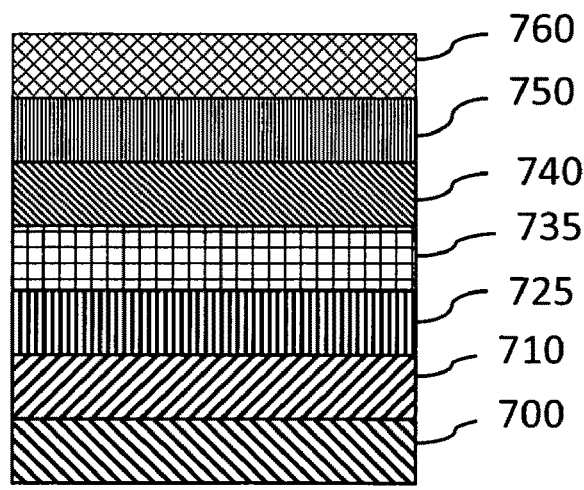
FIG. 8 shows the structure of a solar cell described in Example 7.

In another embodiment of the present invention a solar cell FIG. 8 similar to that of Example 1 was constructed but only the first interface layer 735 and the second interface layer $Mo_xTe_y$ 725 are p-doped with copper. Copper content of p-doped $MoTe_2$ is in the range of less than about 1 to about 10 atomic percent of Copper. A substrate 700 has coated thereon a Mo electrode 710 as before. CdTe semiconductor absorber layer 740 is deposited on top of the first interface layer 735 followed by a window layer 750 and transparent conductor 760.

EXAMPLE 8

Figure 9:
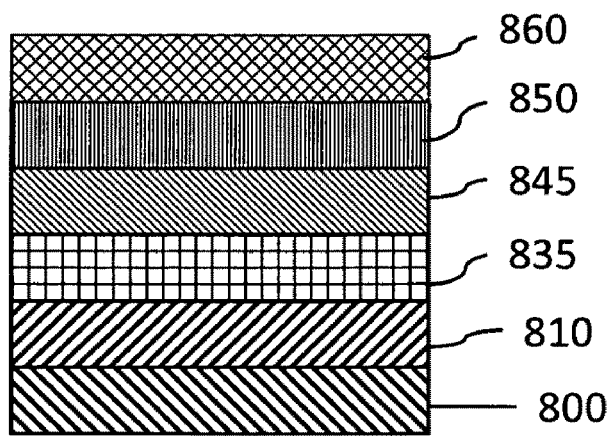
FIG. 9 shows the structure of a solar cell described in Example 8.

In another embodiment of the present invention FIG. 9 there is not an excess of initial Mo layer (which may be made by depositing a thinner Mo layer relative to the Te layer thickness) and therefore there is not a separate Mo layer after the annealing step. Here the MoTe$_2$ layer is suitable as the back electrode. Electrode/interface layer 820 comprises Mo$_x$Te$_y$, and the first interface layer 835. Absorber layer 845 is p-doped with copper. A thin layer of Mo is deposited and the Mo layer is either completely used or substantially used interdiffused during the annealing so there is no detectable Mo layer. A first interface layer 835 comprises a p-doped CdTe:Mo$_x$Te$_y$ composition. Window layer 850 is deposited on top of the absorber layer 845 followed by the TCO layer 860.

EXAMPLE 9

Figure 10:
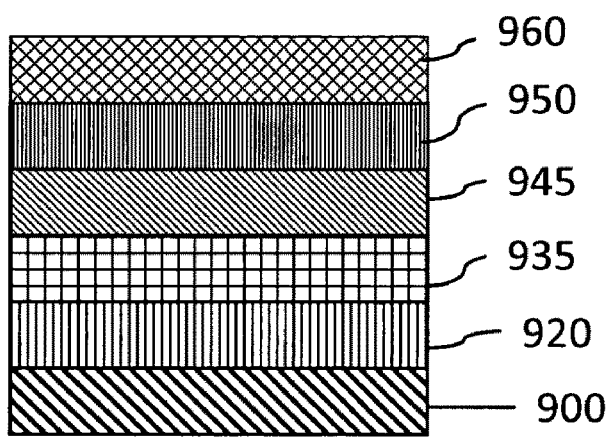
FIG. 10 shows the structure of a solar cell described in Example 9.

In another embodiment shown in FIG. 10 there is not an excess of initial first metal layer comprising Mo (made by depositing a thinner Mo layer relative to the Te layer thickness) and therefore there is not a separate Mo layer after the annealing step. Here the invention contemplates that the Mo$_x$Te$_y$ layer is suitable as the back electrode. This layer may be any thickness generally between 50 and 1000 nm. The back electrode 920 is made by an electrode/interface layer comprising Mo$_x$Te$_y$. This device is made similarly to the device of Example 1 except that a thin first metal layer of Mo is deposited and the Mo layer is interdiffused with the second layer comprising a Group VIA element of Te during the annealing so completely that there is no detectable Mo layer. A first interface layer 935 comprises a p-doped CdTe:Mo$_x$Te$_y$ composition. Window layer 950 is deposited on top of the absorber layer 945 followed by the TCO layer 960.

EXAMPLE 10

Figure 11:
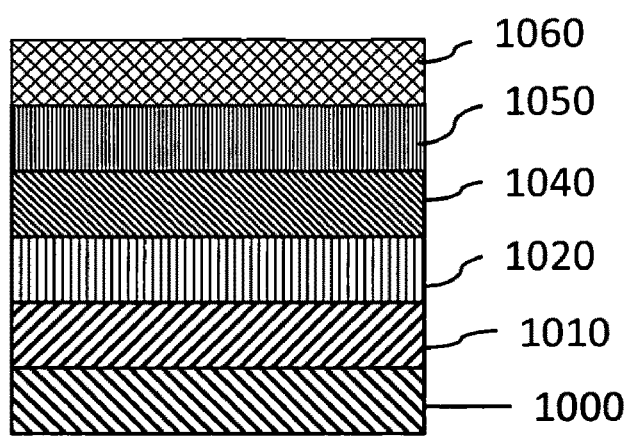
FIG. 11 shows the structure of a solar cell described in Example 10.

In another embodiment of the present invention a solar cell FIG. 11 is disclosed similar to that of Example 5 except the interface layer 1020 is undoped Semiconductor absorber layer 1040 is on Mo$_x$Te$_y$ interface layer 1020 followed by a window layer 1050 and transparent conductor 1060. Metal electrode 1010 is Mo.

It is understood that the embodiments described herein disclose only illustrative but not exhaustive examples of the layered structures possible by the present invention. Intermediate and/or additional layers to those disclosed herein are also contemplated and within the scope of the present invention. The invention as described herein is suitable for both superstrate and substrate configurations.

All patents, publications and disclosures disclosed herein are hereby incorporated by reference in their entirety for all purposes.

What is claimed is:

1. A photovoltaic device, comprising:
   a substrate,
   a back electrode layer,
   an absorber layer comprising CdTe, and
   an interface layer disposed between the back electrode layer and the absorber layer,
   wherein
   the interface layer comprises a first interface composition comprising Mo$_x$Te$_y$, where $0<x\leq3$ and $0<y\leq4$.

2. A photovoltaic device according to claim 1, wherein: the interface layer comprises MoTe$_2$ and/or Mo$_3$Te$_4$.

3. A photovoltaic device according to claim 2, wherein: the interface layer and/or the absorber layer are p-doped.

4. A photovoltaic device according to claim 3, wherein: the dopant comprises copper.

5. A photovoltaic device according claim 1, wherein:
   the interface layer comprises a first interface layer and a second interface layer,
   wherein said first interface layer is disposed next to the absorber layer and said second interface layer is disposed next to said back electrode, and said first interface layer comprises a mixture comprising CdTe and said first interface composition and said
   second interface layer comprises Mo$_x$Te$_y$, where $0<x\leq3$ and $0<y\leq4$.

6. A photovoltaic device according to claim 5, wherein: the first interface layer and said second interface layer are either the same or different and comprise MoTe$_2$ and/or Mo$_3$Te$_4$.

7. A photovoltaic device according to claim 5, wherein: the first interface layer, the second interface layer and/or the absorber layer are each independently doped or undoped.

8. A photovoltaic device, comprising:
   a substrate,
   a back electrode layer,
   an absorber layer comprising CIGS and
   an interface layer disposed between the back electrode layer and the absorber layer,
   wherein
   the interface layer comprises a first interface composition comprising Mo$_x$Te$_y$, where $0<x\leq3$ and $0<y\leq4$.

9. A photovoltaic device according to claim 8, wherein: the interface layer comprises MoTe$_2$ and/or Mo$_3$Te$_4$.

10. A photovoltaic device according to claim 9, wherein: the interface layer and/or the absorber layer are p-doped.

11. A photovoltaic device according to claim 10, wherein: the dopant comprises copper.

12. A photovoltaic device according to claim 8, wherein:
    the interface layer comprises a first interface layer and a second interface layer,
    wherein said first interface layer is disposed next to the absorber layer and said second interface layer is disposed next to said back electrode, and said first interface layer comprises a mixture of CIGS and said first interface composition, and said second interface layer comprises Mo$_x$Te$_y$, where $0<x\leq3$ and $0<y\leq4$.

13. A photovoltaic device according to claim 12, wherein: the first interface layer and said second interface layer are either the same or different and comprise MoTe$_2$ and/or Mo$_3$Te$_4$.

14. A photovoltaic device according to claim 12, wherein: the first interface layer, the second interface layer and/or the absorber layer are each independently doped or undoped.

* * * * *